(12) United States Patent
Furuyama

(10) Patent No.: US 11,328,995 B2
(45) Date of Patent: May 10, 2022

(54) SEMICONDUCTOR DEVICE

(71) Applicant: KABUSHIKI KAISHA TOSHIBA, Tokyo (JP)

(72) Inventor: Hideto Furuyama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 62 days.

(21) Appl. No.: 16/695,560

(22) Filed: Nov. 26, 2019

(65) Prior Publication Data

US 2020/0286833 A1 Sep. 10, 2020

(30) Foreign Application Priority Data

Mar. 4, 2019 (JP) .............................. JP2019-038547
Oct. 1, 2019 (JP) .............................. JP2019-181565

(51) Int. Cl.
| H01L 23/538 | (2006.01) |
| H01L 23/12 | (2006.01) |
| H01L 23/492 | (2006.01) |
| H01L 23/498 | (2006.01) |
| H01L 23/13 | (2006.01) |

(52) U.S. Cl.
CPC .......... *H01L 23/5381* (2013.01); *H01L 23/12* (2013.01); *H01L 23/4922* (2013.01)

(58) Field of Classification Search
CPC ....................................................... H01L 23/12
See application file for complete search history.

(56) References Cited

U.S. PATENT DOCUMENTS

| 7,928,552 B1* | 4/2011 | Cho .................... H01L 23/552 |
| | | 257/686 |
| 2001/0033010 A1 | 10/2001 | Tanioka et al. |
| 2006/0172566 A1 | 8/2006 | Nakajima et al. |
| 2013/0093079 A1* | 4/2013 | Tu ....................... H01L 23/3114 |
| | | 257/737 |
| 2017/0271291 A1* | 9/2017 | Cha .................... H01L 23/49811 |
| 2018/0233448 A1* | 8/2018 | Mohammed ........... H01L 21/563 |

FOREIGN PATENT DOCUMENTS

| JP | S61-133586 A | 6/1986 |
| JP | H9-283252 A | 10/1997 |
| JP | 2001-281300 | 10/2001 |
| JP | 2006-210851 | 8/2006 |

* cited by examiner

*Primary Examiner* — Omar F Mojaddedi
(74) *Attorney, Agent, or Firm* — Finnegan, Henderson, Farabow, Garrett & Dunner L.L.P.

(57) ABSTRACT

According to one embodiment, a semiconductor device includes at least a package substrate, an external electrode, a mounting substrate, and a mounting electrode. A signal connection point of the external electrode is provided at an end portion in a longitudinal direction of the external electrode. A signal connection point of the mounting electrode is provided at an end portion of the mounting electrode. The end portion of the mounting electrode is opposite to the signal connection point of the external electrode facing to the mounting electrode in the longitudinal direction.

5 Claims, 8 Drawing Sheets

SEMICONDUCTOR DEVICE

CROSS-REFERENCE TO RELATED APPLICATIONS

This application is based upon and claims the benefit of priority from Japanese Patent Application No. 2019-038547, filed on Mar. 4, 2019, and Japanese Patent Application No. 2019-181565, filed on Oct. 1, 2019; the entire contents of all of which are incorporated herein by reference.

FIELD

Embodiments described herein relate generally to a semiconductor device.

BACKGROUND

A PGA (Pin Grid Array), a BGA (Ball Grid Array), a LGA (Land Grid Array), etc., are used as packages of semiconductor integrated circuits such as LSI, etc.; and among these, the PGA and the LGA are board-mountable by using a socket or the like without using fixation by solder fusion, and are used as repairable packages that are detachable and re-attachable as necessary.

DETAILED DESCRIPTION

Figure 1B:
FIGS. 1A to 1C are schematic configuration diagrams showing a semiconductor device of a first embodiment.

As the integration density of LSI has been increased, the size of the package has been enlarged and the terminal pitch of the package has been reduced due to the increase of the number of necessary terminals on the package. However, while solder ball mounting having a terminal pitch of about 0.3 mm has been realized for the BGA, the terminal pitch for the PGA and the LGA has remained at about 0.5 mm due to the mechanical precision; and it is difficult to realize a narrow terminal pitch of a repairable package that does not use solder fusion.

An embodiment of the invention is directed to provide a semiconductor device in which a narrower terminal pitch of 0.3 mm or less is effectively realizable and excellent connection characteristics at extremely high frequencies can be provided even in a repairable package.

According to one embodiment, a semiconductor device includes at least a package substrate, an external electrode, a mounting substrate, and a mounting electrode. A semiconductor chip is mountable to the package substrate. The external electrode is provided at an external electrode formation surface of the package substrate. The external electrode has an electrical contact surface. The electrical contact surface at the external electrode formation surface is longer in a signal transmission direction than in a direction orthogonal to the signal transmission direction. The package substrate is mounted on the mounting substrate. The mounting electrode is provided at a position of the mounting substrate opposing the external electrode. The mounting electrode has an electrical contact surface. The electrical contact surface of the mounting electrode is longer in a signal transmission direction than in a direction orthogonal to the signal transmission direction. A signal connection point of the external electrode is provided at an end portion in a longitudinal direction of the external electrode. A signal connection point of the mounting electrode is provided at an end portion of the mounting electrode. The end portion of the mounting electrode is opposite to the signal connection point of the external electrode facing to the mounting electrode in the longitudinal direction.

Embodiments will now be described with reference to the drawings as appropriate. For convenience of description, the scale in each drawing is not always accurate; and relative positional relationships, etc., may be used. Also, the same or similar components are marked with the same reference numerals.

A semiconductor integrated circuit such as LSI or the like is a device used as the core of an information communication device; and the necessary number of terminals on the package is increasing as the integration density necessary for the performance improvement of the semiconductor integrated circuit increases. To this end, the size of the package has been enlarged and the terminal pitch of the package has been reduced; but as described above, while a terminal pitch of 0.3 mm has been realized for the BGA using micromounting technology using fusion of micro solder balls, for the PGA and the LGA which require a mechanical-electrical contact mechanism, the realizable terminal pitch due to the scaling limit of the mechanical-electrical contact mechanism is about 0.5 mm.

As the electrical contact mechanism described above, a pin socket array is generally used for the PGA; and a spring terminal array of C-shaped springs or cantilever springs is generally used for the LGA. Both arrays have independent spring mechanisms for each terminal and maintain the terminal contact by pressing by the spring elasticity. Accordingly, in these repairable packages in which LSI is interchangeable without operations such as solder reflow or the like that cause member degradation, the downscaling of the spring mechanism determines the terminal pitch; and the limit of narrowing the terminal pitch is caused by the mechanical configuration.

On the other hand, a repairable package that has a relatively fine terminal pitch can be configured using a LGA package and an anisotropic conductive contactor such as those shown in Japanese Patent Application Publication No. Sho 61-133586, Japanese Patent Application Publication No. Hei 9-283252, and Japanese Patent Application Publication No. 2001-281300. In such a case, the conductive core wire pitch of the anisotropic conductive contactor determines the LGA package terminal pitch; for example, in the case of an anisotropic conductive contactor having a conductive core wire pitch of 50 μm, a LGA package that has a terminal pitch of about 0.3 mm is realizable. However, it is necessary to reduce the contact resistance by ensuring the electrode pad surface areas of the LGA package and the mounting substrate, i.e., the number of conductive core wires of the anisotropic conductive contactor contacting the electrode pads; and even in such a case, a narrow terminal pitch of 0.3 mm or less is substantially difficult.

First Embodiment

Figure 1A:
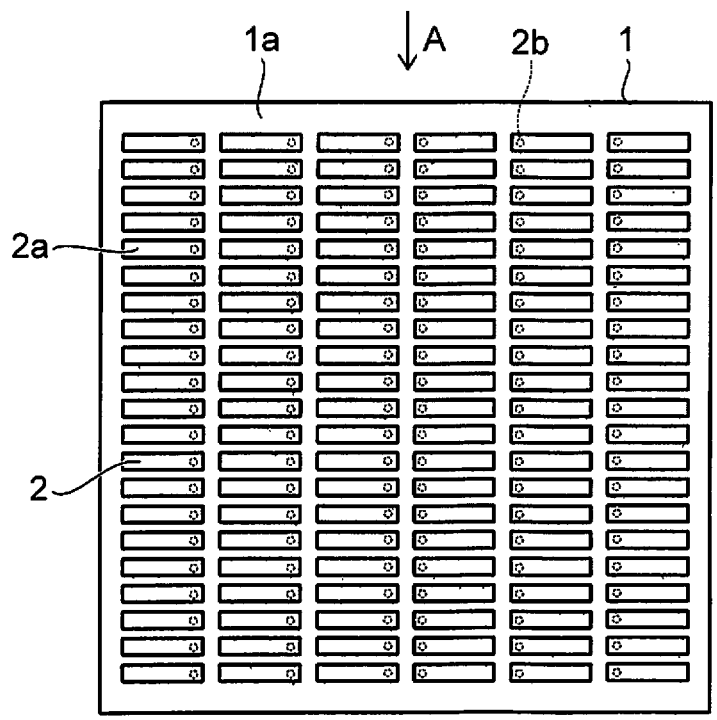
Figure 1C:
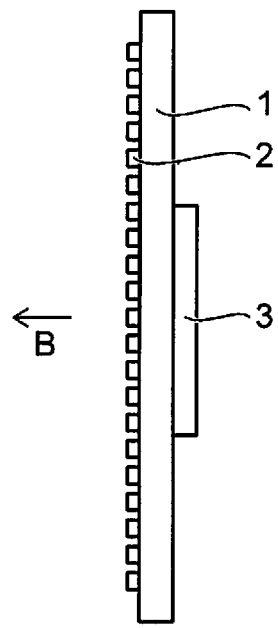

FIGS. 1A to 1C are schematic configuration diagrams showing a first embodiment. FIG. 1A is a plan view of an external electrode formation surface 1a of a package substrate 1; FIG. 1B is a view along arrow A in FIG. 1A; and FIG. 1C is a view along arrow B in FIG. 1A.

Multiple external electrodes (hereinbelow, also called package terminals; and the electrical contact surfaces also are called electrode pads) 2 are provided at the external electrode formation surface 1a of the package substrate 1. For example, a semiconductor chip 3 such as LSI or the like is mounted on the surface of the package substrate 1 on the side opposite to the external electrode formation surface 1a.

The external electrode 2 has an electrical contact surface 2a which is a substantially flat surface, and a signal connection point 2b. The electrical contact surface 2a (the pad configuration) is long in the lateral direction of FIG. 1A and short in the vertical direction of FIG. 1A. In the external electrode formation surface 1a shown in FIG. 1A, for example, the lateral direction is the signal transmission direction. The size in the signal transmission direction of the electrical contact surface 2a is longer than the size in a direction (the vertical direction of FIG. 1A) orthogonal to the signal transmission direction. This configuration is the configuration for the electrical contact surface 2a; and when the external electrode 2 other than the electrical contact surface 2a is covered with, for example, a solder resist, any configuration may be used inside the solder resist (on the package substrate 1 side). The signal connection point 2b is located on a signal source side of the electrical contact surface 2a. The signal connection point 2b is provided at an end portion in the longitudinal direction of the electrical contact surface 2a. A signal is transmitted toward an end portion of the electrical contact surface 2a, opposite to the signal connection point 2b. The embodiment realizes a substantially narrower terminal pitch or a partially narrower terminal pitch for only the necessary portions by a configuration such as the following.

Generally, the portion of the semiconductor package that needs a narrower terminal pitch is the signal transmission terminals; and fine terminals are not really necessary for power supply terminals and control terminals. Therefore, for example, by forming the signal transmission terminals at a narrower pitch and the power supply terminals and/or the control terminals at a relatively wide terminal pitch, an effectively narrower terminal pitch is possible. However, asymmetric package terminal configurations often are prohibited for solder fusion-type packages (BGA, etc.) and terminal-fixed packages (PGA, etc.) due to problems such as terminal damage caused by thermal stress concentration, etc. In particular, the terminal connection of a solder fusion-type package such as the BGA or the like is made uniform by utilizing the surface tension of the melted solder; therefore, it is difficult to apply an asymmetric terminal configuration such as that shown in FIG. 1A. This can be seen from descriptions such as that of Patent Literature 4 in which the solder connection portion is set to be circular even when a noncircular electrode configuration is necessary.

On the other hand, in a LGA package that is electrically connected only by mechanical contact, problems do not occur easily even for electrode pads such as those of FIG. 1A because stress relief is possible by the terminals shifting in a direction parallel to the contact surface. In the embodiment, by providing a narrower pitch for the signal transmission terminals, and particularly for high-speed transmission terminals, a LGA package that has an effectively narrow terminal pitch is realized. In other words, according to the embodiment, a repairable package that has narrower-pitch terminals of substantially 0.3 mm or less is realizable; in particular, a semiconductor device can be provided in which the connection characteristics at extremely high frequencies are excellent.

Figure 2:
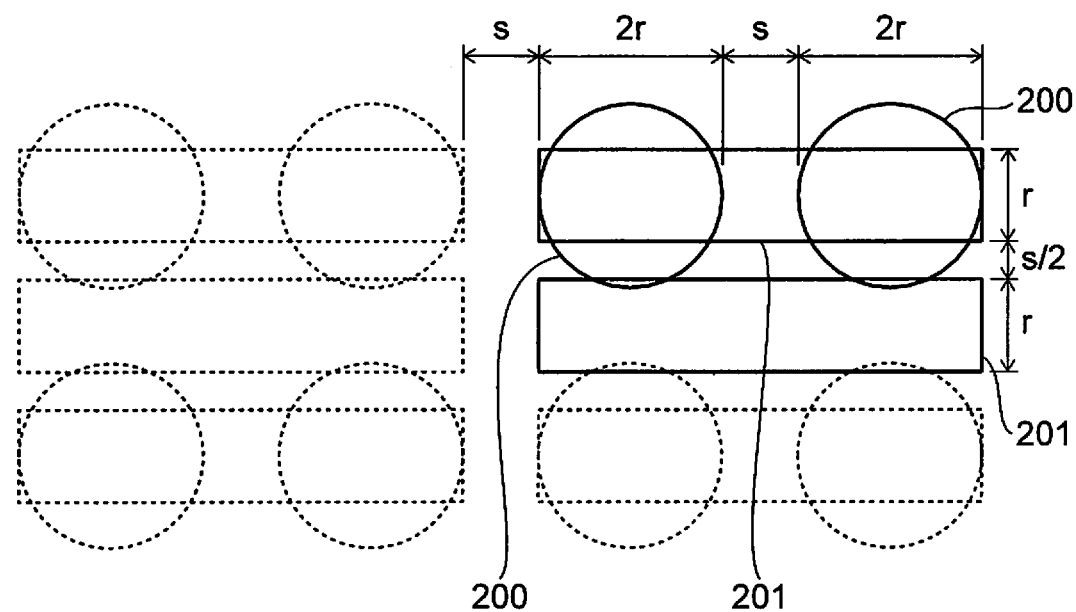
FIG. 2 is an explanation drawing of a configuration of an electrical contact surface of the semiconductor device of the first embodiment.

FIG. 2 is a schematic configuration diagram describing the configuration of the electrode pads shown in FIG. 1A; two of each of a circular electrode pad 200 used in a general package and an electrode pad 201 used in the embodiment are shown by solid lines as a minimum unit for comparison; and the other broken lines show the repeated arrangement of the electrode pads. Here, a configuration that is easily used in a relative comparison to the circular electrode pad of the general package is selected as an example; and the electrode pad 201 is not limited to the configuration of FIG. 2.

In FIG. 2, the radius of the circular pad 200 is taken as r; and the spacing between the adjacent electrodes is taken as s; that is, the pad pitch (the terminal pitch), is taken as 2r+s. Of course, r and s are settable to any value. The width (the width in the direction orthogonal to the signal transmission direction) of the electrode pad 201 is set to r; the length (the length in the signal transmission direction) of the electrode pad 201 is set to the amount for two circular pads (4r+s); and the dedicated surface area per pitch is $(2r+s)^2=4r^2+4rs+s^2$ for the circular pad 200 and $(4r+2s)(r+s/2)=4r^2+4rs+s^2$ for the electrode pad 201, and is exactly the same between the circular pad 200 and the electrode pad 201. On the other hand, the pad pitch of the electrode pads 201 is 4r+2s=2(2r+s) in the lateral direction of FIG. 2 and (2r+s)/2 in the vertical direction of FIG. 2, and compared to the circular pad 200, is double-pitch in the lateral direction of FIG. 2 and ½ pitch in the vertical direction of FIG. 2.

In such a case, the electrode surface area is $\pi r^2$ for the circular pad 200 and $4r^2+rs$ for the electrode pad 201; and the electrode pad 201 has a wider surface area by the amount of $(4-\pi)r^2+rs$. In other words, it can be seen that for the same dedicated surface area, the terminal pitch can be ½ albeit in only a designated direction; the electrode surface area can be even wider; and the contact resistance can be equal or less. This is useful when performing high density wiring of high-speed signal terminals, etc., and means that, for example, the pitch of drawing out the high-speed wiring of the package in the right direction in FIG. 2 can be reduced to ½, and the transmission band density per unit width can be increased to 2 times.

In particular, when performing differential wiring, the package terminals and the mounting substrate terminals can be arranged to be parallel in a symmetric configuration; therefore, the electromagnetic field symmetry of the differential signal can be maintained easily; the impedance mismatch of the electrode pads can be suppressed easily; and for the wave motion, reflections can be minimized. In other words, the wiring band density can be increased to 2 times; and the quality of the high frequency signal transmission can be improved.

It is possible to realize such a terminal pitch using the circular pad 200 by setting the total dedicated surface area of the electrode pad to be the same using two columns of the circular pads 200; but it is necessary to use an arrangement in which, for example, if the high-speed wiring is drawn out in the right direction of FIG. 2, one of the differential wiring is the circular pad 200 on the outer side (the right side of FIG. 2); and the other is the circular pad 200 on the inner side (the left side of FIG. 2). In such a case, as a total of the wiring of the package terminals and the wiring of the mounting substrate terminals, the wiring length and the wiring bending configuration can be made symmetric between the differential wiring; but due to the combination of the long wiring on the package substrate and the long wiring on the mounting substrate, problems easily occur such as transmission waveform distortion being generated easily due to the asymmetry of the wiring material, the wiring thickness, etc.; a portion of the differential transmission mode being converted into a common mode, etc. Also, for general transmission line design (e.g., a line of 50Ω), the transmission line (wiring) width is drastically narrower than the electrode pad 200; and the wiring width must be widened at the electrode pad portion. Therefore, the impedance mismatch and the wave-motion signal reflections easily become large; and the transmission quality of the high frequency signal degrades easily. As a result, the signal speed (the wiring band) is suppressed undesirably; therefore, the band density is undesirably low compared to the electrode pad 201.

For the surface area of the electrode pad, if applications to BGA packages are ignored, it is possible to increase the electrode surface area by using a square pad having sides of 2r instead of the circular pad 200. Even in such a case, the dedicated surface area per pitch can be the same as the circular pad 200; and the surface area of the electrode pad can be widened to $4r^2$. However, in such a case as well, the surface area of the electrode pad 201 is wider by the amount of rs; and the dominance is not changed for the contact resistance, the high-speed transmission quality, the transmission band density, etc. Although the space in the lateral direction of FIG. 2 between the electrode pads 201 is s, the electrode surface area (the contact surface area) can be widened further by the amount of rs/2 by setting the space to be s/2.

Figure 3A:
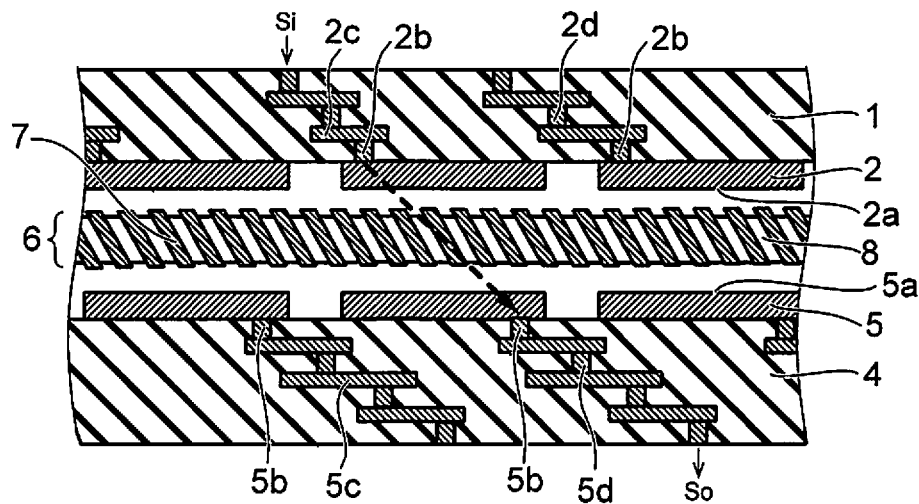
FIGS. 3A to 3C are schematic configuration diagrams showing the semiconductor device of the first embodiment.

FIG. 3A is a schematic cross-sectional view showing the connection state of a LGA package and a mounting substrate 4 in which an anisotropic conductive contactor 6 is used.

Multiple mounting electrodes (mounting substrate terminals) 5 are provided at positions of the mounting substrate 4 opposing the external electrodes (the package terminals) 2 of the LGA package. The mounting electrode 5 has an electrical contact surface 5a. A size of the electrical contact surface 5a in the signal transmission direction is longer than a size of the electrical contact surface 5a in a direction orthogonal to the signal transmission direction. A signal connection point 5b of the mounting electrode 5 is provided at an end portion in the longitudinal direction opposite to the signal connection point 2b of the external electrode 2 of the LGA package. The signal connection point 2b of the external electrode 2 is a connection via (for example, a filled via) provided on the package substrate 1. The signal connection point 5b of the mounting electrode 5 is a connection via (for example, a filled via) provided on the mounting substrate 4. The signal connection point 2b and the signal connection point 5b are located at opposite ends in the longitudinal direction of the external electrode 2 and the mounting electrode 5 facing each other. The signal connection point 2b of the external electrode 2 is electrically connected to an inner interconnection 2c and an inner via 2d provided in the package substrate 1. The signal connection point 5b of the mounting electrode 5 is electrically connected to an inner interconnection 5c and an inner via 5d provided in the mounting substrate 4.

The anisotropic conductive contactor 6 is inserted between the electrical contact surface 2a of the external electrodes 2 and the electrical contact surface 5a of the mounting electrodes 5. In the anisotropic conductive contactor 6, conductive core wires 7 electrically connect the external electrodes 2 and the mounting electrodes 5 by providing a feedthrough connection between the upper and lower surfaces of an insulating member 8 of, for example, a silicone resin, etc.

As described in Patent Literature 2, etc., the electrical connectability is maintained and the elastic deformation due to pressing by the terminals (the package terminals 2 and the mounting substrate terminals 5) on the anisotropic conductive contactor 6 is permitted by forming the conductive core wires 7 obliquely with respect to the electrical connection direction.

A signal is transmitted between the package substrate 1 and the mounting substrate 4 via an electrical contact of an overlapping portion of the external electrode 2 and the mounting electrode 5. A signal is transmitted in the longitudinal direction of the external electrode 2 and the mounting electrode 5. A signal is transmitted to the signal connection point 5b from the signal connection point 2b, or transmitted to the signal connection point 2b from the signal connection point 5b. For example, as shown by the dashed arrow in FIG. 3A, a signal input from Si is output to So. The Si is connected to the signal connection point 2b of the external electrode 2 via the inner interconnection 2c and the inner via 2d. The So is connected to the signal connection point 5b of the mounting electrode 5 via the inner interconnection 5c and the inner via 5d. This structure allows for narrow pitch terminal-to-terminal connections. Further, unnecessary electrode expansion in a direction different from the signal transmission direction can be minimized. This enables high-speed transmission by minimizing the waveform distortion of the transmission signal.

For example, in the case where the signal connection point 2b and the signal connection point 5b are positioned close to the same end portion of the overlapping portion of the external electrode 2 and the mounting electrode 5, the electrode extends in a direction perpendicular to the signal transmission direction from the end portion to the opposite end portion. This is a so-called stub structure that is a major factor in distorting the transmission signal waveform. In the case where the signal connection point 2b and the signal connection point 5b are positioned at the center portion of the overlapping portion of the external electrode 2 and the mounting electrode 5, the stub structure distorting the transmission signal waveform is similarly formed. Therefore, the signal connection point 2b and the signal connection point 5b are preferably positioned close as possible to opposite end portions of the external electrode 2 and the mounting electrode 5 with shifting in different direction from the center portion of the overlapping portion of the external electrode 2 and the mounting electrode 5.

Figure 3B:
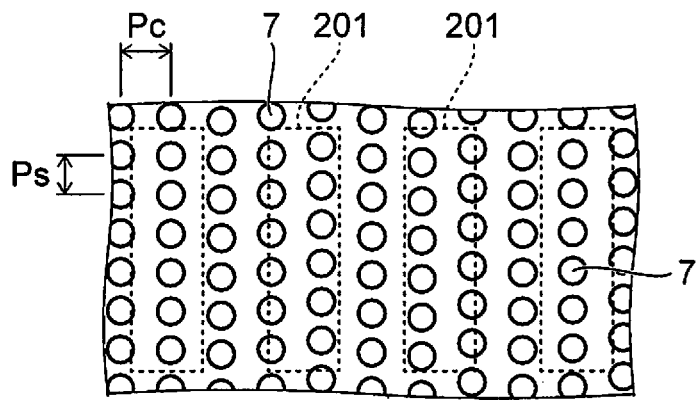

FIG. 3B shows the upper surface (or the lower surface) of the anisotropic conductive contactor 6 and shows the conductive core wires 7 provided in an array configuration. The orderly arrangement of the conductive core wires 7 is dependent on the manufacturing method; and if the arrangement of the conductive core wires 7 is random, the spacing of the conductive core wires 7 is not constant; a nonuniformity of the elastic deformation due to the terminal pressing occurs; dielectric breakdown and/or contact between partially-adjacent conductive core wires 7 occurs; and shorts undesirably occur between the mounting substrate terminals 5 and/or the package terminals 2 to be connected.

In other words, the arrangement uniformity of the conductive core wires 7 relates to the connection reliability of the anisotropic conductive contactor 6; and basically, it is necessary to arrange the conductive core wires 7 at a prescribed pitch. Here, the arrangement pitch of the conductive core wires 7 is taken as Pc; the arrangement pitch is taken as Ps in the orthogonal direction; and it is taken that the asymmetry of Pc>Ps exists.

In FIG. 3B, the broken line shows the contact position of the electrode pad 201 shown in FIG. 2 with the conductive core wires 7. The configuration of the electrode pad 201 is, for example, rectangular; and the width of each side of the electrode pad 201 is not less than the arrangement pitch of the conductive core wires 7 as the condition for at least one of the conductive core wires 7 to contact the electrode pad 201 at some position.

In other words, in FIG. 3B, it is sufficient for the width of the short side of the electrode pad 201 (the rectangle) to be not less than Pc and Ps; and from the assumption recited above, it is sufficient for the short side to be not less than Pc. When the electrode pad 201 is not a rectangle but is, for example, an ellipse, it is sufficient for the maximum width of the minor axis of the ellipse to be not less than Pc. In other words, the arrangement pitches Pc and Ps of the conductive core wires 7 are shorter than the width of the short side of the electrical contact surface of the electrode pad 201. In FIG. 3B, the vertical direction is the signal transmission direction; and the width of the short side of the electrical contact surface of the electrode pad 201 is the width in the direction orthogonal to the signal transmission direction (in FIG. 3B, the lateral direction).

For the rectangular electrode pad 201 described above, all of the electrode pads 201 are in contact with multiple conductive core wires 7 if the short side of the rectangle is not less than Pc, the long side of the rectangle is substantially uniform in the arrangement direction of the conductive core wires 7, and the dimensional relationship is, for example, such as that shown in FIG. 3B; and the number of the conductive core wires 7 contacting one electrode pad may be nonuniform. Such a symptom occurs easily when the width of the electrode pad and the array pitch of the conductive core wires 7 are relatively near each other, that is, for the dimensional relationship to obtain the limiting narrow terminal pitch which is an object of the embodiment. In the case of FIG. 3B, by considering the end portion surface area of the conductive terminals contacting the electrode pad 201, the effective number of conductive terminals contacting the electrode pad 201 is about 6, about 9, about 9, and about 6 from the electrode pad 201 on the left side; and there is a difference of about 1.5 times. This means that the contact resistance fluctuates by about 1.5 times between the electrode pads 201; and the uniformity of the connection is not maintained.

Figure 3C:
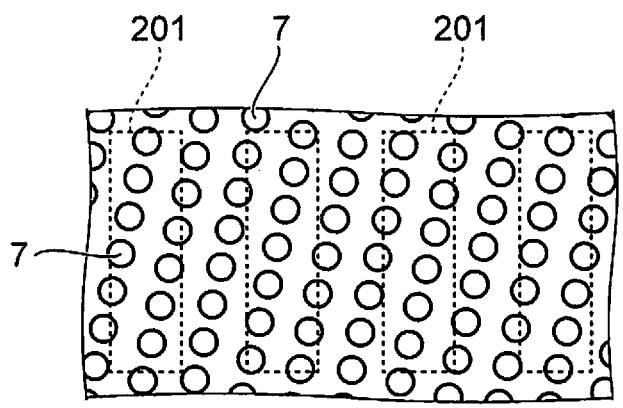

To solve the connection nonuniformity, for example, as shown in FIG. 3C, it is effective to set the long-side direction of the electrode pad 201 (the signal transmission direction) and the arrangement direction of the conductive core wires 7 of the anisotropic conductive contactor 6 deliberately to be different; specifically, the arrangement direction of the conductive core wires 7 is set at an angle with respect to the long-side direction of the electrode pad 201. In FIG. 3C, the arrangement direction of the conductive core wires 7 is tilted about 15° with respect to the long-side direction of the electrode pad 201 (the signal transmission direction); and as a result, the effective number of the conductive terminals in contact is about 8 for each and is uniform.

As a condition of obtaining such an effect of making the connection uniform, it is desirable to set the tilt of the array arrangement of the conductive core wires 7 to be larger than the angle causing the conductive core wires 7 to shift one pitch over the distance of the long side of the electrode pad 201. In other words, when the long-side length of the electrode pad 201 is taken as L and the minimum pitch of the conductive core wires 7 is taken as Ps, it is desirable for $\theta > \tan^{-1}(Ps/L)$; and considering the tilt of the orthogonal axis as well, it is desirable for the tilt $\theta$ to be in a range such that $(90 - \tan^{-1}(Ps/L)) > \theta > \tan^{-1}(Ps/L)$.

As a result, for example, by setting Pc=Ps=50 μm, r=200 μm, and s=100 μm for the dimensional relationship of FIG. 2, the terminal pitch of the circular pad 200 is 0.5 mm; but the short-side terminal pitch of the electrode pad 201 is 0.25 mm; and a LGA package having an extremely narrow pitch can be realized. Because the contact resistance is uniform between the electrode pads, it can be seen that it is sufficient for the arrangement of the conductive core wires 7 of the anisotropic conductive contactor 6 to be tilted in the range of 4° to 86°. In such a case, the long-side terminal pitch of the electrode pad 201 is 1 mm and is large; but by performing the layout of the electrode pads 201 by considering the direction of the high-speed signal wiring, a configuration is possible in which the wiring pitch of the mounting substrate 4 is not limited by the long-side terminal pitch. In other words, an effectively narrower terminal pitch is realized.

Thus, in the embodiment, by providing the signal transmission terminals at a narrower pitch, a LGA package having an effectively narrow terminal pitch is realized; narrower-pitch terminals of 0.3 mm or less are realizable in a repairable package; and a semiconductor device having excellent high frequency connection characteristics can be provided.

Second Embodiment

Figure 4B:
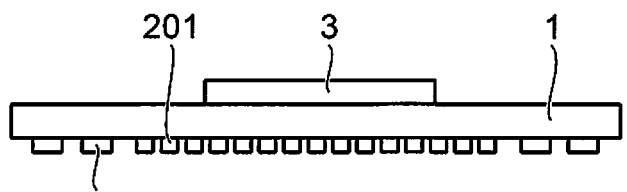
FIGS. 4A to 4C are schematic configuration diagrams showing a semiconductor device of a second embodiment.
Figure 4A:
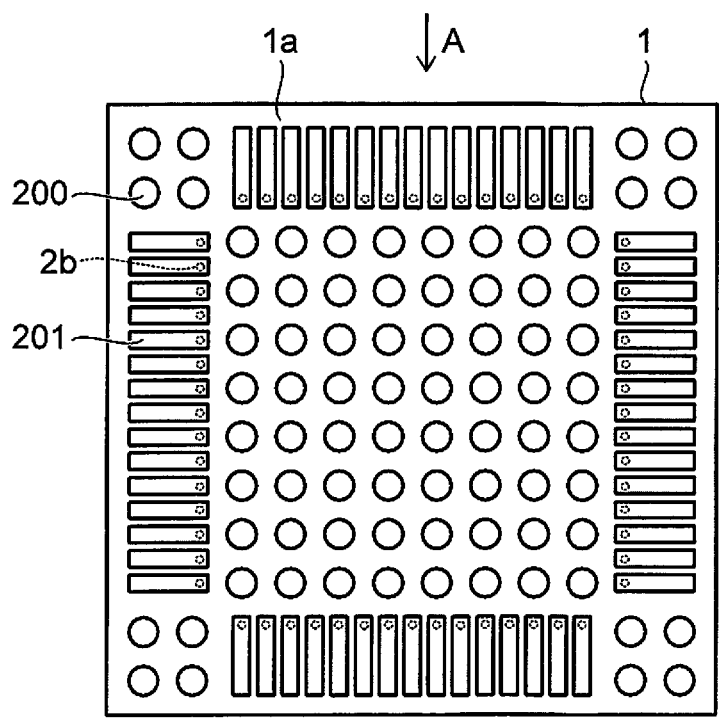
Figure 4C:
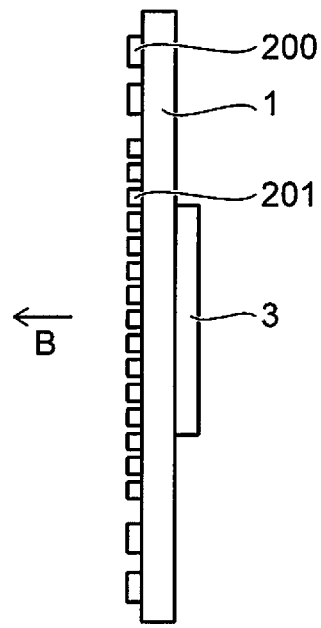

FIGS. 4A to 4C are schematic configuration diagrams showing a second embodiment. FIG. 4A is a plan view of the external electrode formation surface 1a of the package substrate 1; FIG. 4B is a view along arrow A of FIG. 4A; and FIG. 4C is a view along arrow B of FIG. 4A.

The circular external electrode (the electrode pad) 200 and the rectangular external electrode (the electrode pad) 201 are provided at the external electrode formation surface 1a of the package substrate 1. For example, the circular electrode pad 200 and the rectangular electrode pad 201 may have the dimensional relationship of FIG. 2. The electrode pad 200 is not limited to a circle and may be a polygon. The rectangular electrode pad 201 that is formed to be long in a direction toward the outer perimeter of the package substrate 1 and the circular or polygonal electrode pad 200 are formed to coexist at the external electrode formation surface 1a of the package substrate 1.

Here, for example, the output is taken to be a high-speed signal (e.g., a signal speed of 26 Gbps) using differential wiring; and the adjacent electrode pads 201 are used as a pair of terminals of the differential wiring. For example, the circular electrode pad 200 and the rectangular electrode pad 201 are laid out with the dimensional relationship of FIG. 2 in which r=200 μm and s=100 μm. In other words, from each of the four sides of the package substrate 1, the rectangular electrode pads 201 can output high-speed signals at a terminal pitch of 0.25 mm and can be wiring equivalent to that of a package having effectively 0.25-mm-pitch terminals.

In such a case, for example, the pitch of the conductive core wires 7 of the anisotropic conductive contactor 6 is set to Pc=Ps=50 μm; and it is sufficient for the arrangement of the conductive core wires 7 to be tilted 4° to 86° with respect to the rectangular electrode pad 201.

It is sufficient for the power supply terminals, the control terminals, etc., to be supplied or connected by the circular electrode pads 200; and it is no problem for package terminals corresponding to a 0.5-mm pitch to be used for these terminals to ensure the current amount or to connect for a relatively low-speed signal. It is sufficient to consider these terminals effectively to be four 0.25-mm terminals used collectively; and even if a narrow-terminal-pitch package of 0.25 mm actually is realized, a connection corresponding to four terminals is performed to ensure the current amount and/or ensure the connection reliability. For a BGA package or the like, the package mounting height changes according to the terminal pitch because the size of the solder balls used changes according to the terminal pitch. Therefore, it cannot be said that a 0.25-mm pitch is realized because the package height on the mounting board is different between an actually 0.25-mm pitch BGA and an effectively 0.25-mm pitch BGA. However, the embodiment presupposes the LGA as a repairable package; and the package mounting height does not change according to the terminal pitch. In other words, for the actually 0.25-mm-pitch package and the effectively 0.25-mm-pitch package of the embodiment, there is no fundamental difference in the performance; and the effects are equivalent.

Third Embodiment

Figure 5A:
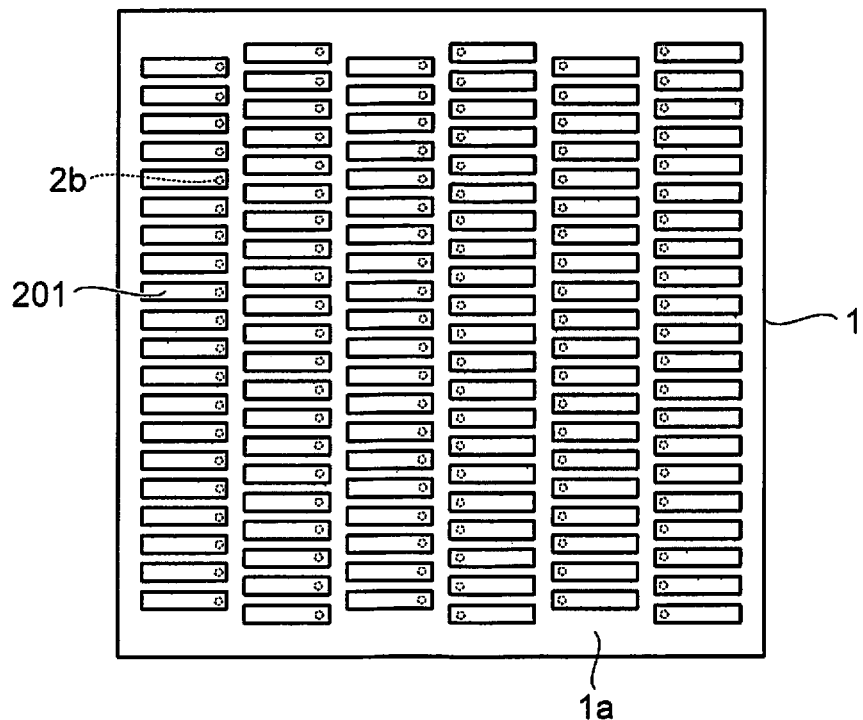
FIGS. 5A and 5B are schematic configuration diagrams showing a semiconductor device of a third embodiment.
Figure 5B:
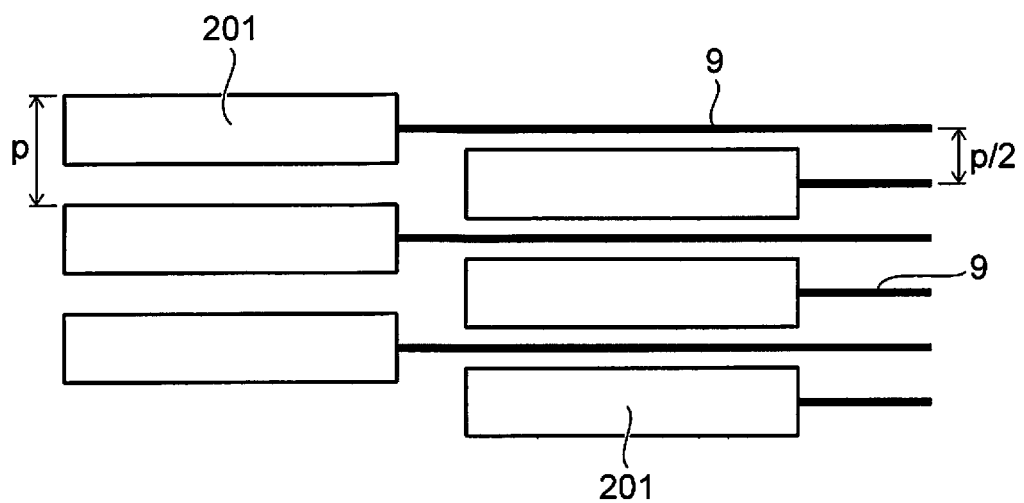

FIG. 5A is a plan view of the external electrode formation surface 1a of the package substrate 1 of a third embodiment. The wiring (e.g., transmission lines) 9 that are drawn out from the rectangular electrode pads 201 of FIG. 5A are shown in FIG. 5B.

In the embodiment, a so-called staggered arrangement is formed by shifting the arrangement relationship of the rectangular electrode pads 201 of two columns by ½ pitch in a direction orthogonal to the signal transmission direction. As a result, as shown in FIG. 5B, it is possible to set the terminal pitch of the rectangular electrode pads 201 to p and to set the pitch of the drawn-out wiring 9 to a half pitch of p/2.

Thereby, when using electrode parameters similar to those of FIGS. 4A to 4C described above, the pitch of the drawn-out wiring 9 is 0.125 mm; and a semiconductor device having a very narrow terminal pitch difficult to realize using the conventional art of BGAs, PGAs, LGAs, etc., can be realized.

Figure 6B:
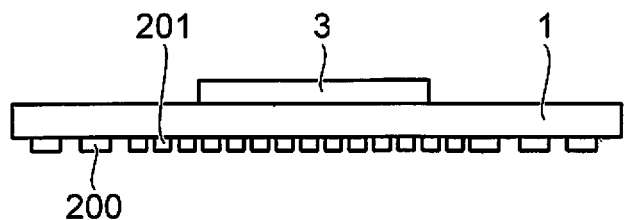
FIGS. 6A to 6C are schematic configuration diagrams showing the semiconductor device of the third embodiment.
Figure 6A:
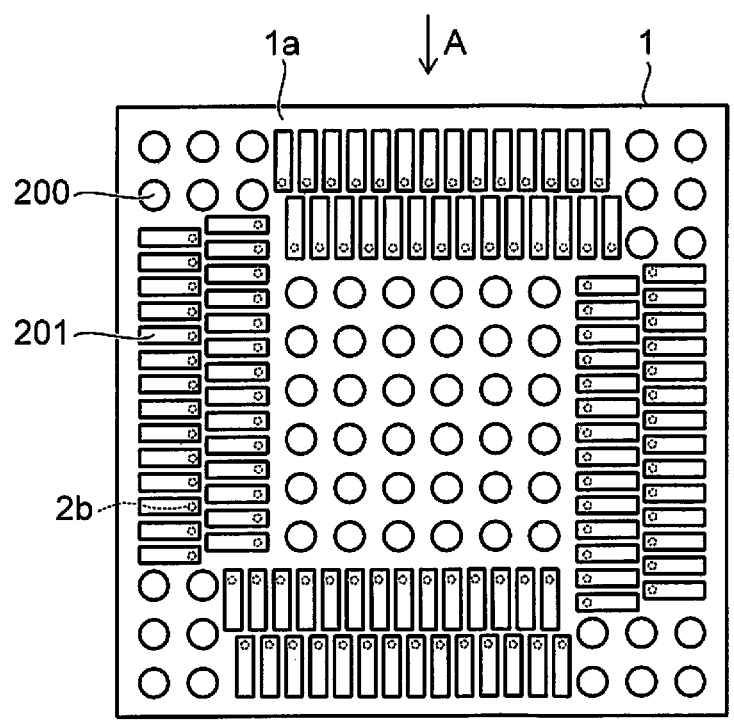
Figure 6C:
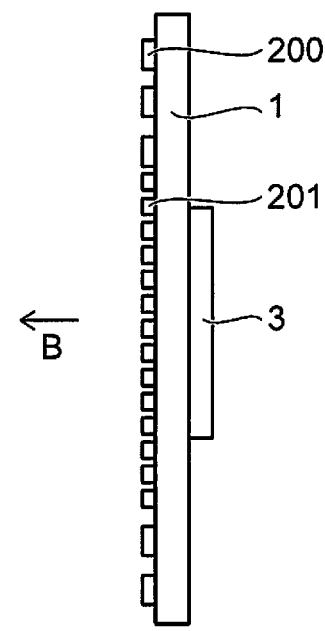

FIGS. 6A to 6C show an embodiment in which the rectangular electrode pads 201 shown in FIG. 5A are applied to package terminals similar to those of FIGS. 4A to 4C. Thereby, a high-speed signal is outputtable at a terminal pitch of 0.125 mm from each of the four sides of the package substrate 1, that is, a package having effectively 0.125-mm-pitch terminals can be realized.

Fourth Embodiment

Figure 7:
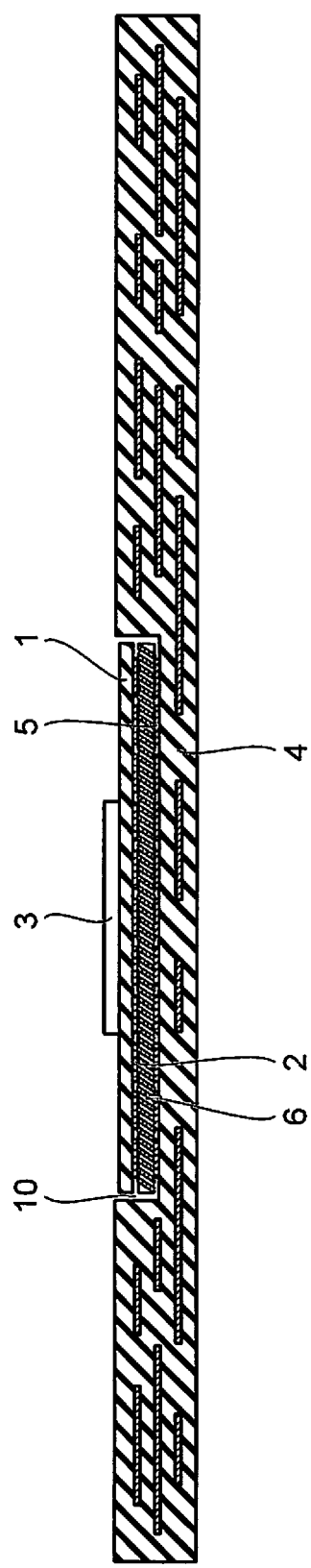
FIG. 7 is a schematic configuration diagram showing a semiconductor device of a fourth embodiment.

FIG. 7 is a schematic configuration diagram showing a fourth embodiment. The mounting substrate 4 has a cavity 10 made of a partial recess; and the mounting electrodes (the mounting substrate terminals) 5 are provided at the bottom surface of the cavity 10.

In such a case, the positional alignment between the external electrodes (the package terminals) 2 of the package substrate 1 and the mounting electrodes 5 of the mounting substrate 4 is simplified; and it is sufficient to drop the package substrate 1 into the recess of the cavity 10 of the mounting substrate 4. Of course, the connection is performed by inserting the anisotropic conductive contactor 6 between the package substrate 1 and the mounting substrate 4 and by mounting a holder (not illustrated) pressing the package substrate 1.

In such a case, the exterior form of the anisotropic conductive contactor 6 is cut to match the recess configuration of the cavity 10 of the mounting substrate 4. The recess opening of the cavity 10 is set to be a polygon; and the exterior form of the anisotropic conductive contactor 6 matches the configuration of the recess opening of the cavity 10. The exterior form of the anisotropic conductive contactor 6 is cut in a direction causing the arrangement direction of the conductive core wires 7 to be different from the direction of each side of the package terminals 2 and the mounting substrate terminals 5.

Fifth Embodiment

Figure 8:
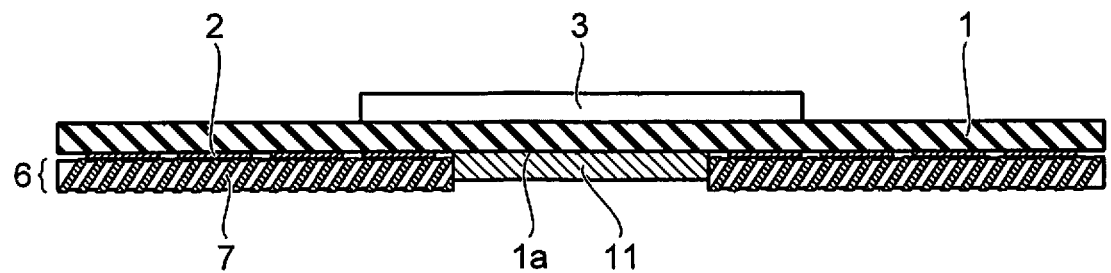
FIG. 8 is a schematic configuration diagram showing a semiconductor device of a fifth embodiment.

FIG. 8 is a schematic configuration diagram showing a fifth embodiment, and is an embodiment in which the anisotropic conductive contactor 6 is temporarily fixed by engaging a protrusion (a convex portion) 11 formed in the package substrate 1.

The protrusion 11 is provided partially at the external electrode formation surface 1a of the package substrate 1; and the anisotropic conductive contactor 6 is held by the protrusion 11. The protrusion 11 may be, for example, a heat-dissipating metal, etc.

By setting the height of the protrusion 11 to be lower than the thickness of the anisotropic conductive contactor 6, the protrusion 11 can be used as a stopper when pressing the package substrate 1. The protrusion 11 can be a height-regulating jig that prevents pressing in excess of the elastic limit of the anisotropic conductive contactor 6.

Figure 9:
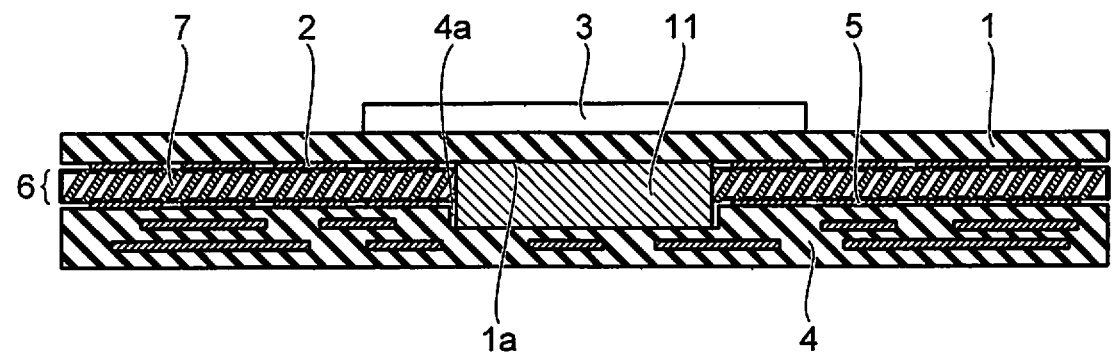
FIG. 9 is a schematic configuration diagram showing a semiconductor device of the fifth embodiment.

As shown in FIG. 9, the protrusion 11 may be higher than the thickness of the anisotropic conductive contactor 6 and may be used to engage with a recess 4a provided in the mounting substrate 4. The recess 4a is provided at a position of the mounting substrate 4 opposing the protrusion 11. The position of the package substrate 1 on the mounting substrate 4 is determined by engaging the protrusion 11 and the recess 4a.

Sixth Embodiment

Figure 10:
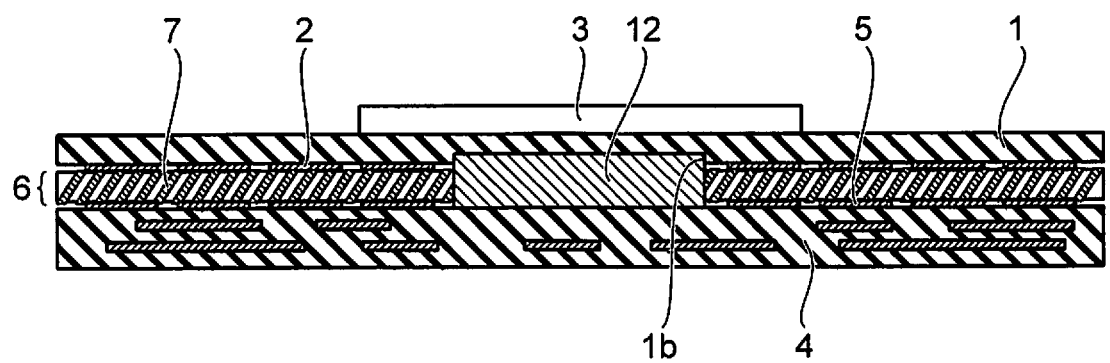
FIG. 10 is a schematic configuration diagram showing a semiconductor device of a sixth embodiment.

FIG. 10 is a schematic configuration diagram showing a sixth embodiment, and is an embodiment in which the anisotropic conductive contactor 6 is temporarily fixed by engaging a protrusion (a convex portion) 12 formed at the mounting substrate 4. The anisotropic conductive contactor 6 is held by the protrusion 12. The protrusion 12 may be, for example, a heat-dissipating metal, etc.

A recess 1b is provided partially in the external electrode formation surface 1a of the package substrate 1; and the protrusion 12 is provided at a position of the mounting substrate 4 opposing the recess 1b. The position of the package substrate 1 on the mounting substrate 4 is determined by engaging the protrusion 12 and the recess 1b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising at least:
   a package substrate, a semiconductor chip being mountable to the package substrate;
   an external connection electrode provided at an external connection electrode formation surface of the package substrate, the external connection electrode having an electrical contact surface, the electrical contact surface at the external connection electrode formation surface being longer in a signal transmission direction than in a direction orthogonal to the signal transmission direction;
   a mounting substrate where the package substrate is mounted; and
   a mounting electrode provided at a position of the mounting substrate opposing the external connection electrode, the mounting electrode having an electrical contact surface, the electrical contact surface of the mounting electrode being longer in a signal transmission direction than in the direction orthogonal to the signal transmission direction,
   each longitudinal direction of the external connection electrode and the mounting electrode are aligned in the signal transmission direction,
   the external connection electrode having a first signal connection point provided at a first end portion in a longitudinal direction of the external connection electrode, and
   the mounting electrode having a second signal connection point provided at a second end portion of the mounting electrode,
   the second end portion of the mounting electrode being opposite, in the longitudinal direction, to the first signal connection point of the external connection electrode facing to the mounting electrode.

2. The device according to claim 1, wherein the external connection electrodes have a staggered arrangement in the direction orthogonal to the signal transmission direction at the external connection electrode formation surface of the package substrate.

3. The device according to claim 1, wherein the external electrode having the electrical contact surface and a circular or regular-polygonal external electrode are formed to coexist at the external electrode formation surface of the package substrate.

4. The device according to claim 1, further comprising:
   a first via connected to the first signal connection point of the external connection electrode; and
   a second via connected to the second signal connection point of the mounting electrode.

5. The device according to claim 1, further comprising:
   a first transmission line provided at the external connection electrode formation surface of the package substrate and connected to the first signal connection point of the external connection electrode, and
   a second transmission line provided at the mounting substrate opposing the external connection electrode formation surface of the package substrate and connected to the second signal connection point of the mounting electrode.

* * * * *